United States Patent [19]

Slabaugh

[11] Patent Number: 4,650,064
[45] Date of Patent: Mar. 17, 1987

[54] SUBSTRATE ROTATION METHOD AND APPARATUS

[75] Inventor: Edward J. Slabaugh, San Jose, Calif.

[73] Assignee: Comptech, Incorporated, San Jose, Calif.

[21] Appl. No.: 775,760

[22] Filed: Sep. 13, 1985

[51] Int. Cl.⁴ ............................................. B65G 41/00
[52] U.S. Cl. ................................. 198/631; 51/237 M;
    51/419; 118/500; 118/730; 198/802; 204/298
[58] Field of Search ................. 198/631, 468.6, 468.9,
    198/704, 802, 378; 118/500, 729, 730; 204/192
    R, 298; 366/211, 214; 269/57; 51/237 M, 419

[56] References Cited

U.S. PATENT DOCUMENTS

| 818,916 | 4/1906 | Rodgers | 198/704 X |
| 3,699,298 | 10/1972 | Briody | 118/730 X |
| 3,983,838 | 10/1976 | Christensen | 118/500 |
| 4,051,010 | 9/1977 | Roth et al. | 204/298 |
| 4,548,698 | 10/1985 | Sellschopp | 204/192 R |

FOREIGN PATENT DOCUMENTS 2095704 3/1982 United Kingdom .
2135700 1/1984 United Kingdom .

Primary Examiner—Robert J. Spar
Assistant Examiner—Jonathan D. Holmes
Attorney, Agent, or Firm—Thomas Schneck

[57] ABSTRACT

A frame which carries a plurality of circular substrates seated in grooves in planar alignment. The substrates are seated in grooves defined within the circumferential periphery of apertures within the frame. Each groove and aperture have a diameter slightly larger than the substrate, with the groove contacting only a fraction of the rim of the substrate so that the substrate may orbit within the groove as the frame is provided with circular oscillations. This causes rotation of the substrate in the groove, i.e. the rim of the substrate "walks" around the inner circumference of the groove.

16 Claims, 3 Drawing Figures

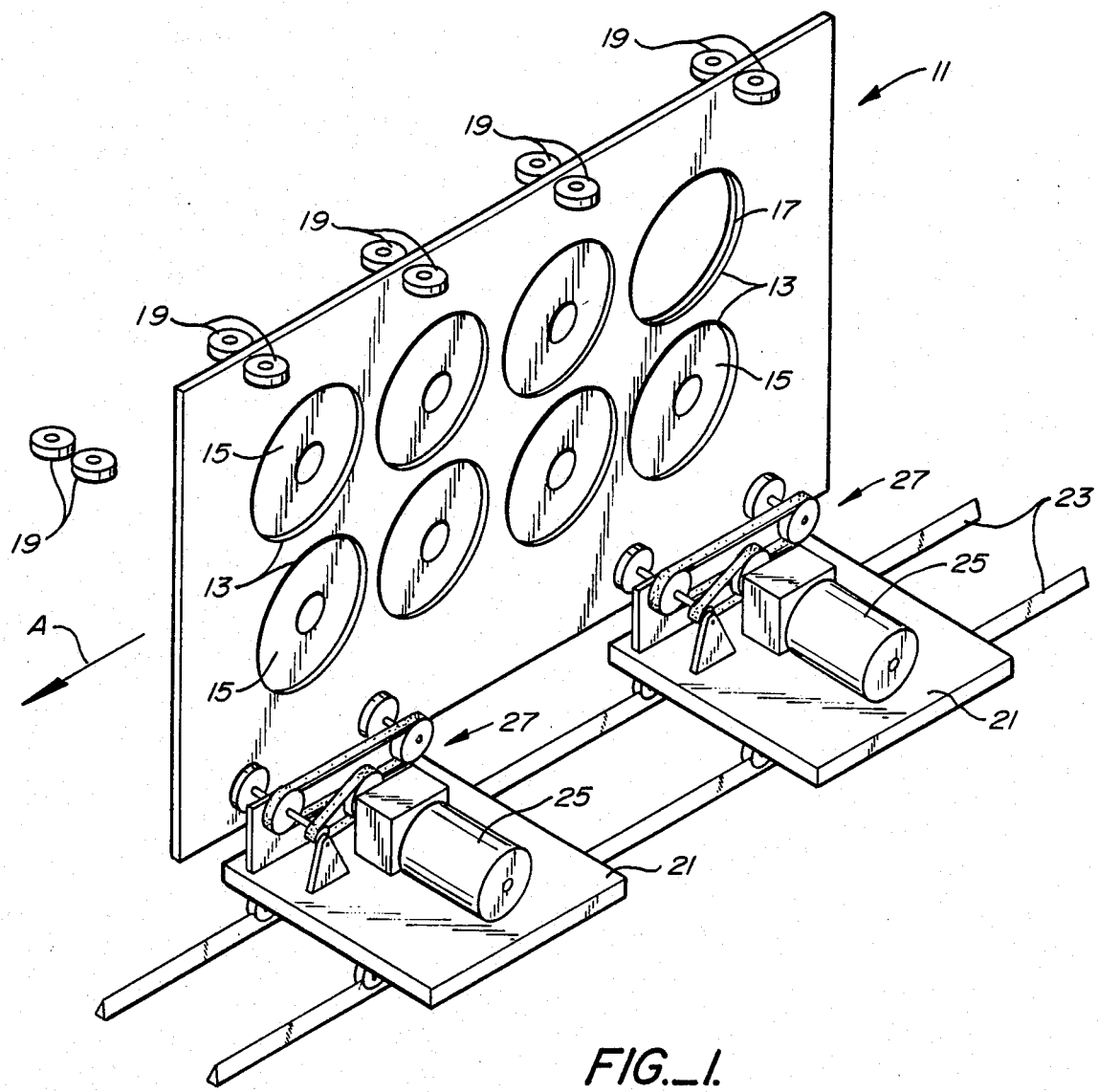
FIG._1.

U.S. Patent  Mar. 17, 1987  Sheet 2 of 2  4,650,064
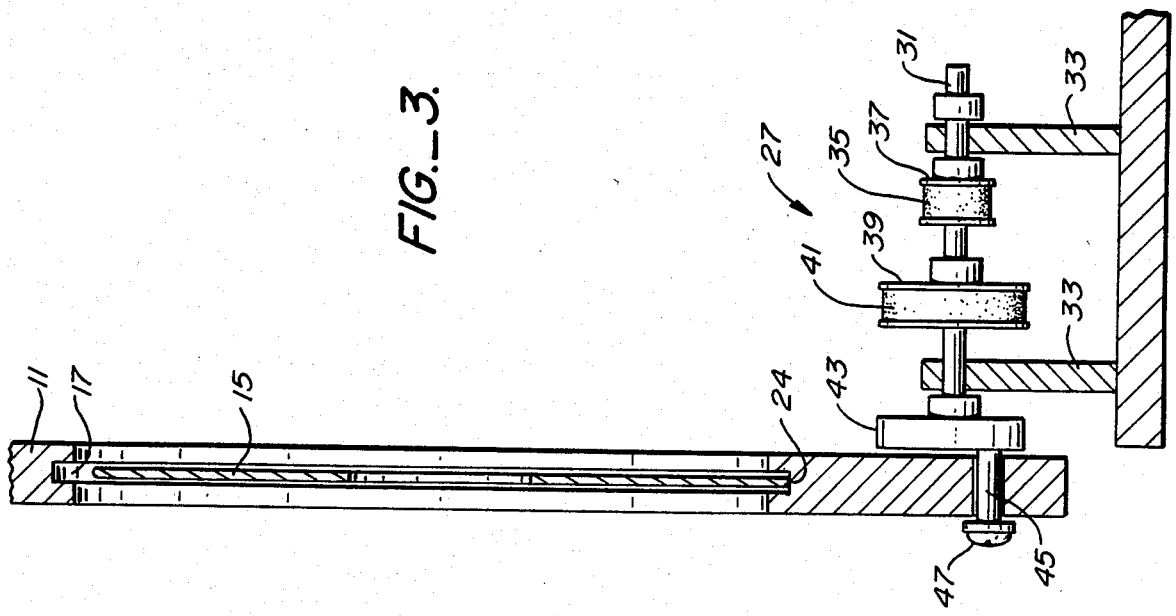
FIG._3.
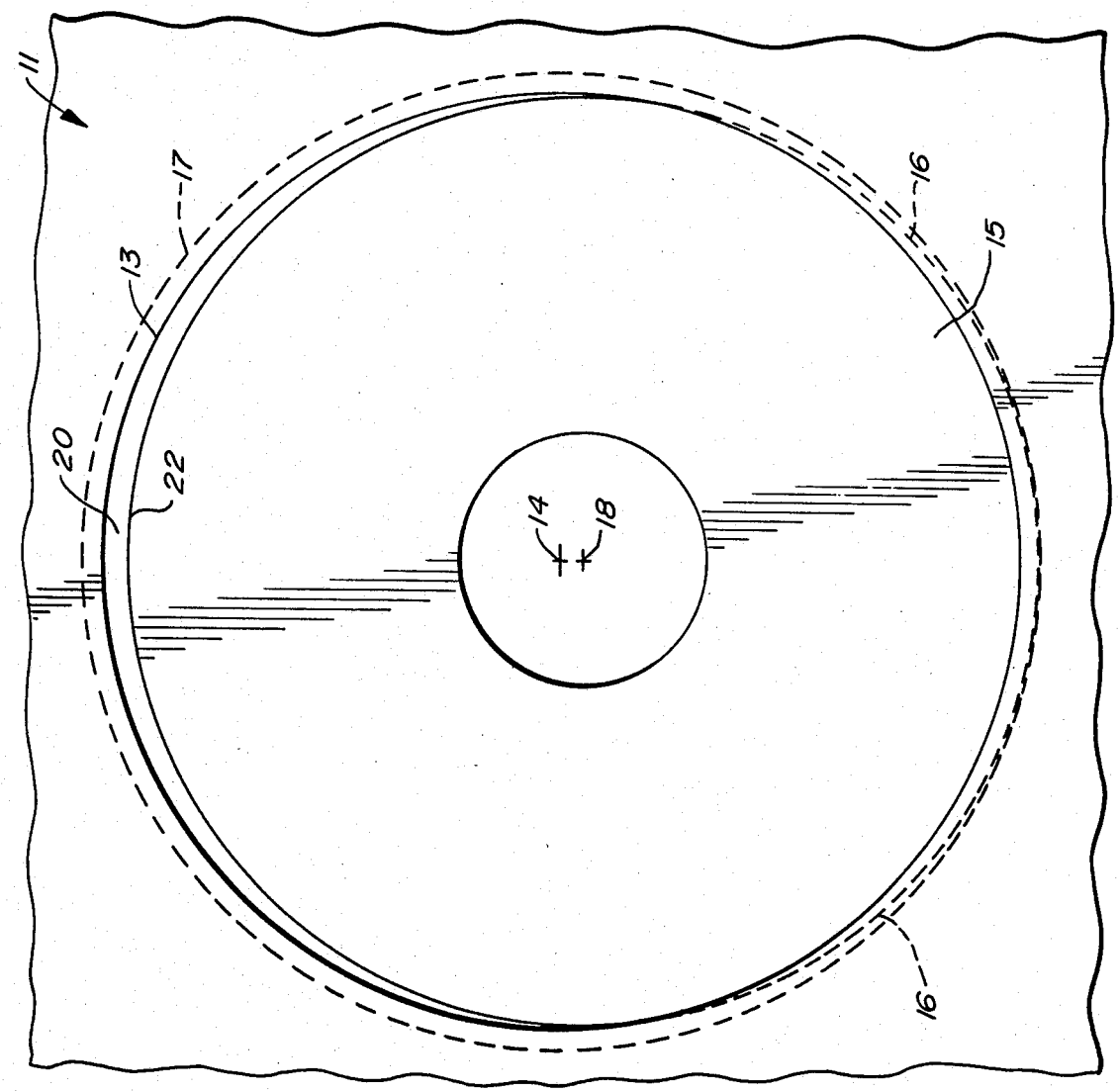
FIG._2.

SUBSTRATE ROTATION METHOD AND APPARATUS

TECHNICAL FIELD

The invention relates to substrate rotation for sputtering and similar surface treatment.

BACKGROUND ART

It is generally known that rotation of a substrate during vapor plating, vapor deposition or sputtering is desirable to promote uniformity in the surface treatment. For example, in U.S. Pat. No. 3,983,838 there is disclosed a planetary evaporator wherein substrates are turned during surface treatment. This patent as well as others teach the need for circular rotation of a substrate.

Most prior devices for treating substrates do so in a cylindrical enclosure in which the substrates are rotated within the inner periphery of the cylinder. This limits the throughput of the system and essentially treats batches of substrates. Others have recognized this and have provided linear or in-line systems wherein wafers are loaded into one end of the system and traverse a linear path, emerging at the opposite end of the system. Such an apparatus is shown in U.K. patent application No. 2,095,704 A. In such linear systems, it has been previously recognized that rotation of the substrate during surface treatment is desirable. An example of a carrier with means for rotating individual substrates is shown in U.K. patent application No. 2,135,700 A.

An object of the invention was to provide a means for rotating a plurality of wafers traveling through an in-line surface treatment system, such as a sputtering system.

DISCLOSURE OF THE INVENTION

The above object has been achieved with the discovery of a substrate carrier adapted for linear motion which can simultaneously rotate a plurality of disk-shaped substrates, while occupying very little space. Briefly, the substrates are held in a planar frame provided with a plurality of apertures slightly oversize with respect to disk-shaped substrates. Each aperture has a groove machined into the circular periphery of the aperture, the groove loosely seating the circular substrate, allowing the substrate to orbit inside of the groove with a circular motion. There is little lateral wobble since the substrate is held by approximately one-third to forty percent of its peripheral circumference being inside of the groove. With respect to the remaining sixty percent or so of the substrate, there is a slight air gap between the groove and the circumferential periphery of the substrate.

A circular motion is imparted to the frame supporting the substrates by means of a cam or motor with a crank. This circular motion, which is relatively rapid and of short amplitude, is transferred to the substrates which travel about the grooves with a slow orbital motion about the inside of the groove brought about by centrifugal force. If the frame containing the substrates is simultaneously advanced in its lengthwise direction, a point on the periphery of a substrate traces an epicycle. Alternatively linear translation of the frame may be interspersed with rotational motion.

BRIEF DESCRIPTION OF THE DRAWINGS

FIG. 1 is a perspective view of the apparatus of the present invention.

FIG. 2 is a detail of a frame having a groove for seating a circular substrate.

FIG. 3 is a side elevation of a portion of the apparatus shown in FIG. 1.

BEST MODE FOR CARRYING OUT THE INVENTION

With reference to FIG. 1 a frame 11 is shown having a plurality of apertures 13. Each aperture seats a substrate 15 having a circular circumference. The substrates may be annular disks, as shown, or wafers or similar substrates which have been prepared for surface treatment. Many surface treatments such as sputtering, chemical vapor deposition, vapor plating and other forms of surface coating require a turning or rotation of the substrate in its plane so that a uniform coating is applied. I have discovered that by providing small amplitude, high frequency vibrations to frame 11, the substrates may be forced to rotate slowly in their own vertical planes within grooves, such as groove 17 machined or otherwise cut into frame 11.

Frame 11 is supported upright by idlers 19 and by one or more carriages 21 which carry the frames. Alternatively, the frame may be carried by rollers or other mechanisms for providing support. Each of the carriage 21 rides on a pair of rails 23 extending in a lengthwise direction so that frame 11 may be moved in the direction indicated by arrow A. The carriages 21 may be propelled by a drive belt, not shown. The carriages are located at a known distance from one another by such a belt or other motive source. It is not necessary that the carriages be provided with motion. The function performed in the present invention may be carried out in a stationary position.

Frame 11 is preferably made of a strong, self-supporting material, such as a panel of sheet aluminum. The upper edge of the panel may be coated with a low-friction substance so that the panel will slide up and down through idlers 19. Alternatively, the idlers 19 may be made of a low-friction material such as nylon or Teflon so that the frame 11 can be rotated transverse to the direction of motion of the panel.

Each of the carriages supports a motor 25 and a drive assembly 27 for transferring power to the frame.

FIG. 2 shows a detail of frame 11. Aperture 13 is cut into the frame, with a shallow groove, indicated by dashed line 17, cut into the lateral center of the opening. Groove 17 is circularly concentric with the aperture, having the common center 14. The depth of groove 17 is only a few millimeters, being sufficient to grip the lower circumferential periphery of substrate 15. The fine dashed line 16 indicates the circumferential portion of substrate 15 which is seated in the groove. The annular substrate 15 has a center 18 which is slightly lower than center 14 because only the lower portion of the substrate is seated in the groove. At the upper portion of the substrate there is a gap 20 between the upper rim 22 of the substrate and the groove. The small amplitude vibrations which are provided to the frame must be larger than the gap 20, but need not be more than about one to three cm. in amplitude. Small amplitude circular oscillations to frame 11, at a rapid rate, say 3600 revolutions per minute, cause the substrate 15 to slowly rotate in the groove, at a rate of perhaps one revolution per minute.

With reference to FIG. 3, the motive mechanism 27 is illustrated supporting frame 11. Drive shaft 31 is mounted on support braces 33. Power is transferred to shaft 31 by means of a power belt 35. The diameter of the supporting pulley 37 is selected to produce the appropriate rate of rotation of the frame 11. A power transfer reel 39 is provided so that shaft power may be transferred to a second pulley also contacting the frame. A belt 41 having teeth for synchronizing reel 39 with the corresponding reel on the second shaft insures synchronized motion. Shaft 31 is also connected to a circular cam 43 having a crank 45, offset from the center of the cam. The extent of offset from the center of the circular cam defines the amplitude of oscillation of the frame 11. An offset of a centimeter or two will provide an amplitude of twice the offset. This will cause rotation of the substrates. The crank is seen to be secured by a screw 47 which is larger than the hole through which the crank passes, thereby precluding frame 11 from moving off the crank.

Within the frame 11, the groove 17 may be seen to occupy approximately one-third of the width of the frame and to be centrally located within the frame. The substrate 15 may be seen to be resting at the lower periphery 24 of the groove. As crank 45 rotates, causing rotation of frame 11, the substrate 15 will orbit around the inside of the aperture in which it is seated due to centrifugal force on the substrate. The substrate will continue such orbiting in the groove until the oscillations provided to frame 11 are stopped. A surface treatment source might be located in a manner to direct a surface coating in a direction perpendicular to frame 11 and the plane of substrate 15. As the substrate rotates, the depth of the coating will tend to be averaged such that uniform coatings can be applied, assuming that the coating can be applied uniformly across a radius of the substrate.

There is no particular limit to the number of substrates which may be carried by a frame, except that each substrate must have access to a sufficient quantity of plating material within an appropriate housing or plating chamber so that uniform coatings can be attained.

I claim:

1. Method for treating a disk-shaped substrate comprising,
   mounting a disk-shaped substrate in a planar frame having a front side and a rear side, said frame having a section wherein said sides are spaced apart to define an annular groove, the groove having a diameter larger than the diameter of the substrate, whereby the groove retains the substrate, but the substrate is able to rotate within the groove and a portion of the substrate is free from contact with said groove, and
   providing rotational oscillations to the frame, about an axis non-concentric with the substrate, the amplitude of the oscillations being substantially less than the diameter of the substrate, whereby rotational oscillation of the frame causes centrifugal rotation of the substrate about the periphery of said annular groove.

2. The method of claim 1 further defined by providing linear translation to the frame.

3. The method of claim 2 wherein said linear translation provided to the frame is simultaneous with rotational motion.

4. The method of claim 2 wherein said linear translation provided to the frame is interspersed with rotational motion.

5. Apparatus for treating disk shaped substrates comprising,
   a plurality of disk shaped substrates,
   frame means for holding said plurality of disk shaped substrates in planar alignment, said frame means defining a plurality of grooved apertures, each aperture of a diameter slightly larger than the diameter of one of said disk shaped substrates intended to be seated therein, the groove of each aperture being substantially concentric with said aperture and having a front wall and a rear wall, said walls contacting a sufficient fraction of the peripheral surface of a seated disk for retaining the disk in the aperture but not contacting another fraction of the peripheral surface of the same disk so as to allow centrifugal motion of said disk in said groove, and
   means for providing rotational oscillations to the frame, about an axis non-concentric with the disk, the amplitude of the oscillations being substantially less than the diameter of the substrate, whereby rotational oscillation of the frame causes centrifugal rotation of the substrates about the periphery of said grooves.

6. The apparatus of claim 5 further defined by linear path means for guiding said frame in a desired direction.

7. The apparatus of claim 6 wherein said linear path means comprises rollers contacting said frame.

8. The apparatus of claim 6 wherein said linear path means comprises an elongated rail and a carriage disposed in rolling contact with the rail, said carriage supporting said frame.

9. The apparatus of claim 5 wherein said frame means comprises an upright panel.

10. The apparatus of claim 5 wherein said means for providing rotational oscillations to the frame comprises a motor driven crank, said crank connected to said frame means.

11. The apparatus of claim 5 wherein said centrifugal motion of said substrate causes the center of said substrate to circularly orbit the center of said aperture.

12. Apparatus for treating disk shaped substrates comprising,
    a plurality of disk shaped substrates,
    frame means for holding said plurality of disk shaped substrates in planar alignment, said frame means defining a plurality of annularly grooved apertures, each aperture being of a diameter slightly larger than the diameter of one of said disk shaped substrates intented to be seated therein, the annular groove of each aperture contacting a sufficient fraction of the peripheral surface of a seated disk on each side thereof for retaining the disk in the aperture but not contacting another fraction of the peripheral surface of the same disk so as to allow centrifugal motion of said disk in said groove, and
    a motor driven crank, said crank connected to said frame means for providing rotational oscillations to the frame, about an axis non-concentric with the disk, the amplitude of the oscillations being substantially less than the diameter of the substrate, whereby rotational oscillation of the frame causes centrifugal rotation of the substrates in the annular grooves.

13. The apparatus of claim 12 further defined by linear path means for guiding said frame in a desired direction.

14. The apparatus of claim 13 wherein said linear path means comprises rollers contacting said frame.

15. The apparatus of claim 13 wherein said linear path means comprises an elongated rail and a carriage disposed in rolling contact with the rail, said carriage supporting said frame.

16. The apparatus of claim 12 wherein said frame means comprises an upright panel.

* * * * *